(12) United States Patent
Porter, Jr. et al.

(10) Patent No.: US 6,369,598 B2
(45) Date of Patent: Apr. 9, 2002

(54) PNEUMATIC PLANAR PROBE

(75) Inventors: Frank Kendall Porter, Jr., Billerica; James J. Kerrigan, Andover; Samuel Menasha, Chelmsford, all of MA (US)

(73) Assignee: Carlisle Management Company, Inc., Syracuse, NY (US)

( * ) Notice: Subject to any disclaimer, the term of this patent is extended or adjusted under 35 U.S.C. 154(b) by 0 days.

(21) Appl. No.: 09/842,591

(22) Filed: Apr. 26, 2001

Related U.S. Application Data

(60) Provisional application No. 60/200,607, filed on Apr. 28, 2000.

(51) Int. Cl.[7] .............................................. G01R 31/02
(52) U.S. Cl. ........................................ 324/761; 324/754
(58) Field of Search ............................. 324/761, 72.5, 324/149, 158.1, 538, 754, 755, 756, 758, 762, 765; 439/482

(56) References Cited

U.S. PATENT DOCUMENTS 4,061,969 A * 12/1977 Dean ........................... 324/761
4,870,354 A * 9/1989 Davaut ........................ 324/757
5,252,916 A * 10/1993 Stewart ....................... 324/757

* cited by examiner

Primary Examiner—Safet Metjahic
Assistant Examiner—J Kerveros

(74) Attorney, Agent, or Firm—Herbert L. Bello

(57) ABSTRACT

A pneumatic planar probe for electrical transmission lines containing single or multiple contacts is provided for planar termination to a receiving structure. The pneumatic planar probe includes a header, a first probe body and a second probe body that are arranged as an extension of a transmission line having a center conductor and an outer conductor, the first probe body and second probe body extending the outer conductor and center conductor, respectively. The first probe body and second probe body are received in the header. The second probe body is supported in a dielectric body, the second probe body and dielectric body being concentrically slidably mounted in the first probe body. A first probe body interface at a free end of the first probe body is configured to contact a ground planar surface of the receiving structure. A second probe body interface at a free end of the second probe body is configured to contact a signal planar surface of the receiving structure. A first annular volume is pressurized to urge the first probe body interface to press against and become in pressurized contact with the ground planar surface of the receiving structure. A second annular volume is pressurized to urge the second probe body interface to press against and become in pressurized contact with the signal planar surface of the receiving structure. When the first probe body interface is in pressurized contact with the ground planar surface and the second probe body is in pressurized contact with the signal planar surface, the planar probe is in planar termination with the receiving structure.

22 Claims, 14 Drawing Sheets

PNEUMATIC PLANAR PROBE

CROSS-REFERENCES TO RELATED APPLICATIONS

Benefit is claimed under Title 35, United States Code, §119(e) of U.S. Provisional Application No. 60/200,607, filed Apr. 28, 2000.

BACKGROUND OF THE INVENTION

1. Field of the Invention

The present invention relates to electrical probes and, more particularly, is directed toward electrical planar probes employed as cooperative terminations and terminations for transmission lines.

2. Description of the Prior Art

In many test applications, it is necessary to provide for the temporary termination of electrical signal transmission lines to units under test. Often, spring-loaded, single-contact probes are employed for such termination. Arranging the single-contact probe or some other device for the efficient termination of coaxial signal transmission lines has been a long-standing goal. Currently available devices suffer from certain disadvantages and limitations because they do not provide high coaxial termination efficiency. Additionally, spring-loaded devices tend to compromise the transmission efficiency of some coaxial transmission lines since the signal at the transition of the spring device may not encounter a transparent boundary. Further, a test apparatus often requires additional interfaces in the signal transmission path due to other design or manufacturing considerations. Multiple interfaces degrade the performance characteristics due to their collective inefficiency.

In the current and future manufacturing test process of high speed devices, where a large number of test interfaces must be made at once, a need exists for a termination technology barrier that does not suffer from the foregoing disadvantages and limitations.

SUMMARY OF THE INVENTION

It is an object of the present invention to provide a planar probe device that does not suffer from the limitations and disadvantages of prior art devices.

It is a further object of the invention to provide a pneumatic planar probe device which allows planar termination to a receiving structure.

It is yet another object of the present invention to provide a pneumatic planar probe device that establishes and maintains electrical characteristics for the purpose of impedance characteristics matching of the probe.

It is still a further object of the invention to provide planar termination of an electrical transmission line between two cooperative receiving structures, an intermediate interconnecting interface or an interface array.

It is still another object of the invention to provide planar termination of an electrical transmission line to a transmission line receiving structure, a connecting singular interface or an interface array.

It is yet another object of the invention to provide means for selectively activating and deactivating a planar termination on command.

It is a further object of the invention to provide a compensated impedance transition between an electrical transmission line and a transmission line receiving structure.

It is still a further object of the invention to ensure compensated impedance transition between the electrical transmission line and the transmission line receiving structure when signal transmission occurs.

It is also an object of the invention to provide design latitude for the user so that operational forces can be adjusted for impedance transition.

It is also another object of the invention to provide a user adjustable planar probe termination configuration for matching transmission line receiving structure requirements.

It is also a further object of the invention to maximize the design freedom afforded to receiving structures.

It is still a further object of the invention to simplify the manufacture of a planar probe by utilizing simple bodies of revolution and standard assembly techniques.

It is yet another object of this invention to provide increased density in an array of planar probes.

It is another object of the invention to provide a pneumatic planar probe that can be easily inserted and removed from a header.

Other general and specific objects of the invention will in part be obvious and will in part appear hereinafter.

The pneumatic planar probe embodying the invention for electrical transmission lines includes a single contact or multiple contacts that are arranged to permit planar termination to a receiving structure. The probe also establishes and maintains electrical characteristics for the purpose of impedance characteristics matching of the probe. Termination of electrical transmission lines through the probe is complemented with impedance compensation, whereby the probe is transitioned to both the transmission line impedance and the receiving structure impedance. Single or multiple probes can be arranged to mate a receiving structure. Operation of the probe results in an established termination configuration which is reliable and repeatable. Further, the probe can be operated so that a range of contact forces is afforded to the user and the probe can be tailored to individual applications. There are no springs or biasing requirements for the probe. When the probe is not in operation, there are no residual forces involved.

The invention addresses termination technology barrier problems and enhances the practicality of current and future manufacturing test procedures for high speed devices.

The pneumatic planar probe embodying the invention includes a first probe body and a second probe body that are arranged as an extension of a transmission line having a center conductor and an outer conductor. The pneumatic planar probe is received in a header that is configured to be attached to a receiving structure. The first probe body and second probe body extend the transmission line's outer conductor and center conductor, respectively. Support for the second probe body is provided by a dielectric body. The second probe body and the dielectric body are slidably mounted in the first probe body. The first and second probe bodies can be positioned relative to each other such that a first interface of the first probe body and a second interface of the second probe body can achieve any planar position requirement of a receiving structure. A plurality of contact fingers is provided for maintaining electrical continuity with the center conductor regardless of the incremental position of the second probe body relative to the first probe body. A first annular volume is pressurized to urge the first interface to press against and become in pressurized contact with a ground planar surface of the receiving structure. A second annular volume is pressurized to urge the second interface to press against and become in pressurized contact with a signal planar contact of the receiving structure. The pressurized contact of the first interface and the ground plane surface is independent of the pressurized contact of the second interface and the signal planar contact.

In an alternative embodiment of the pneumatic planar probe, the first probe body is made into two independently slidable members that are electrically and mechanically interfaced by means of a plurality of contact fingers. The pneumatic planar probe is held in a header by means of a retaining ring. The header, the pneumatic planar probe and the retaining ring are designed to facilitate both the insertion of the pneumatic planar probe into the header and removal of the pneumatic planar probe from the header.

DETAILED DESCRIPTION OF A PREFERRED EMBODIMENT

Figure 1:
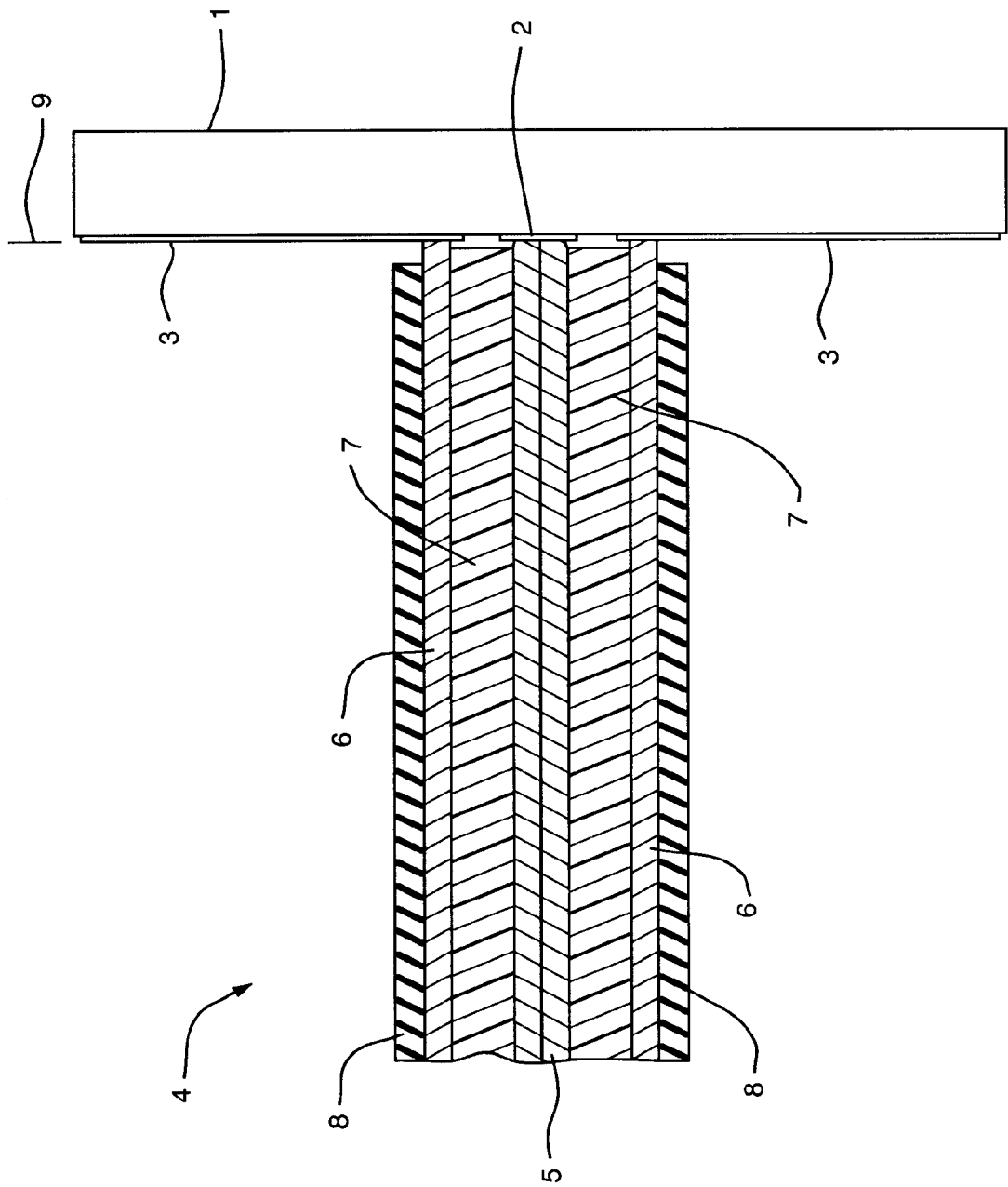
FIG. 1 is a sectional view of an idealized transmission line interface to a receiving structure.

Referring now to FIG. 1, there is shown an idealized transmission line interface to a receiving structure 1. The nature of the prior art difficulties with the interconnection of a transmission line 4 and receiving structure 1 is dramatized in FIG. 1. Receiving structure 1 is constructed with a signal planar surface 2 and a ground planar surface 3. Transmission line 4 includes a center conductor 5 and an outer conductor 6 that are maintained in coaxial alignment by a dielectric body 7. In the illustrated embodiment, outer conductor 6 is covered by a cover 8 that is composed of an insulating material. Transmission line 4 is shown abutting the receiving structure 1 at signal planar surface 2 and ground planar surface 3 such that center conductor 5 and outer conductor 6 of transmission line 4 mate more or less coincidentally at a planar surface 9. The more or less coincidental mating at the planar surface 9 is the nature of the problem with prior art devices. If contact is not made in a manner consistent with the mechanical and electrical requirements of transmission line 4 and receiving structure 1, then signal transmission performance may be degraded or nonexistent. The pneumatic planar probes embodying the present invention are shown in FIGS. 2–14 and described hereinafter.

Figure 2:
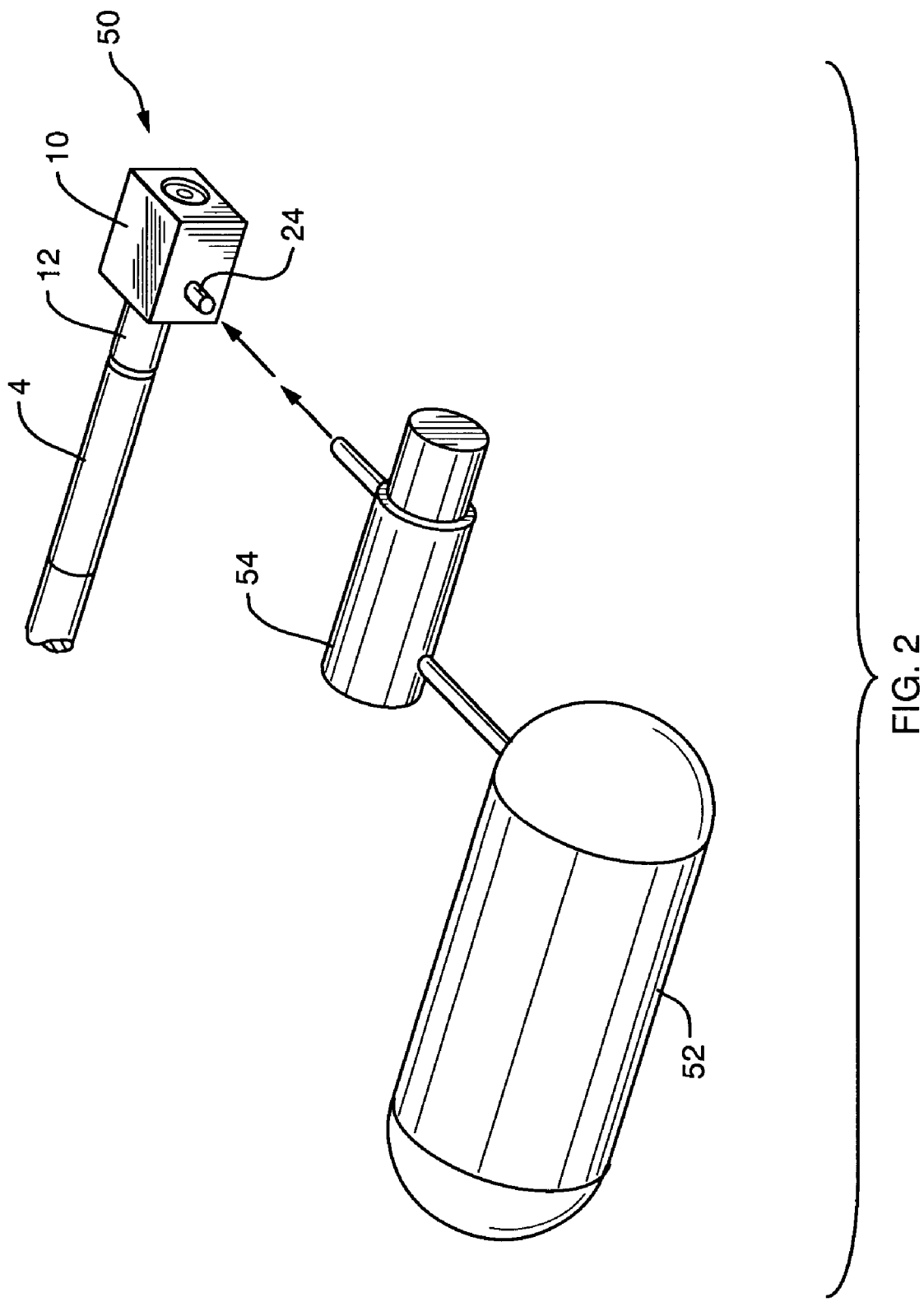
FIG. 2 is a perspective view of a pneumatic planar probe embodying the invention.

Referring now to FIG. 2, a pneumatic planar probe 50 embodying the invention is shown connected to a source of pneumatic pressure or fluid reservoir 52 by means of a controller/regulator 54. As hereinafter discussed, pneumatic fluid, for example, inert nitrogen gas, is supplied to pneumatic planar probe 50 via an orifice or an inlet 24, a controller/regulator 54 selectively applying a selected pneumatic pressure at a selected time to pneumatic planar probe 50.

Figure 4:
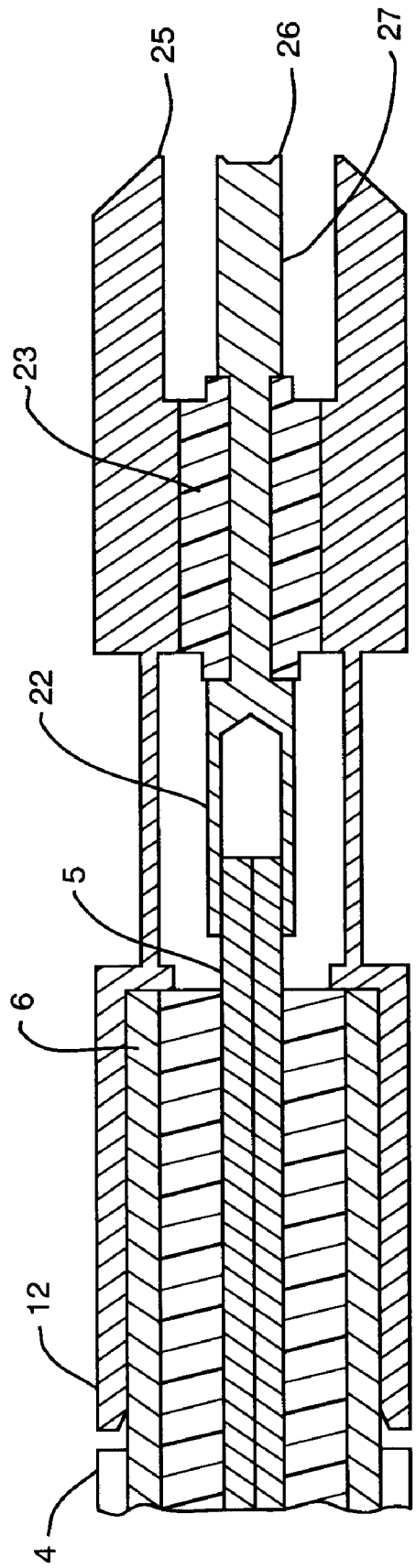
FIG. 4 is a sectional view of a transmission line with extending component bodies incidental to arranging the impedance compensated planar probe of FIG. 2.

Referring now to FIG. 4, it will be seen that two independent bodies, a first probe body 12 and a second probe body 27, are arranged as an extension of the transmission line 4. First probe body 12 and second probe body 27 extend the outer conductor 6 and center conductor 5, respectively, of transmission line 4. Support for the second probe body 27 is provided by a dielectric body 23. The second probe body 27 and the dielectric body 23 are slidably mounted in first probe body 12 and can be positioned relative to each other such that a first probe body interface 25 and a second probe body interface 26 can achieve any planar position requirement of the receiving structure 1. In this arrangement, a plurality of contact fingers 22 maintains electrical continuity with center conductor 5 regardless of the incremental position of second probe body 27.

Figure 3:
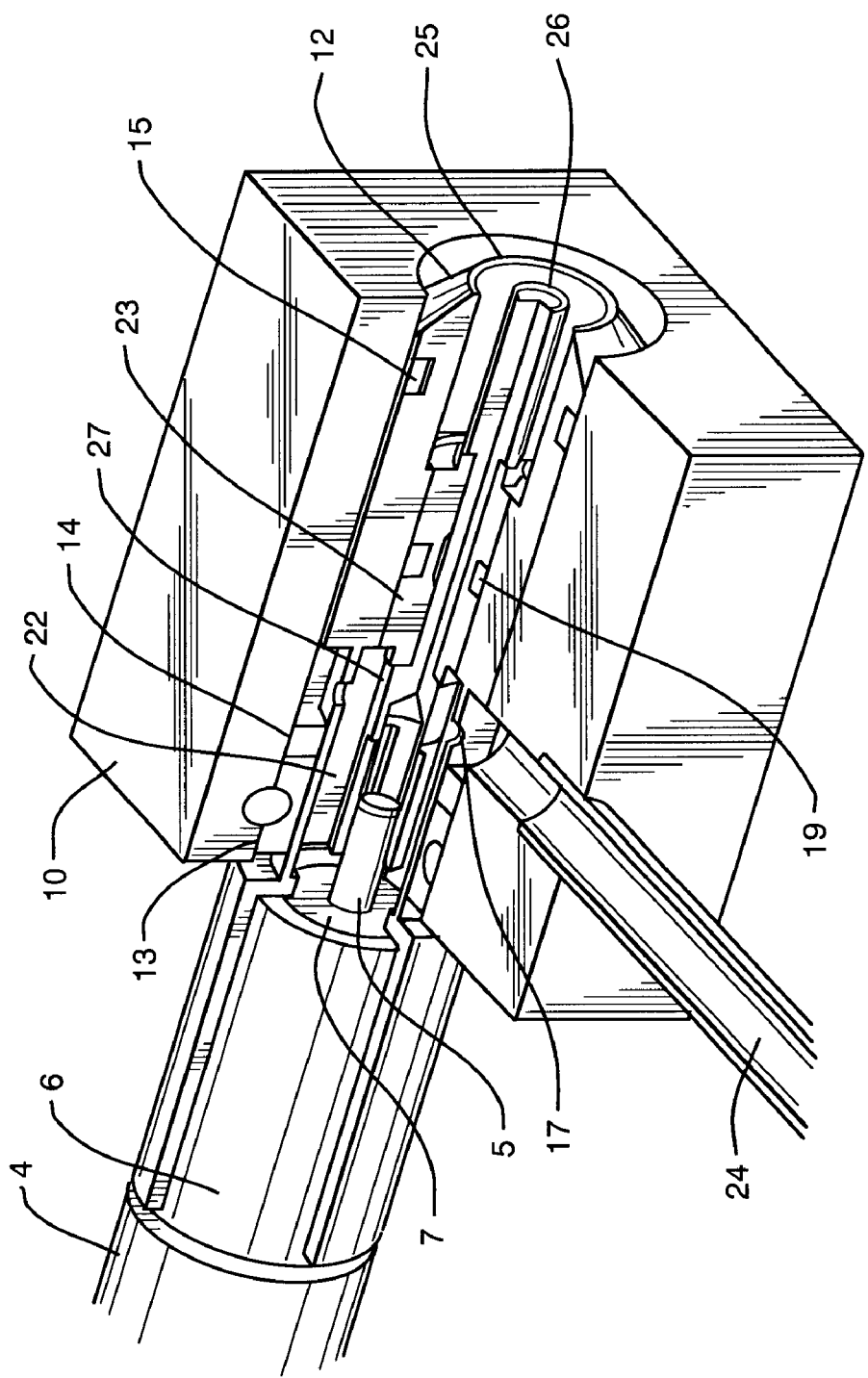
FIG. 3 is a perspective view, partly in section, of the pneumatic planar probe of FIG. 2.
Figure 5:
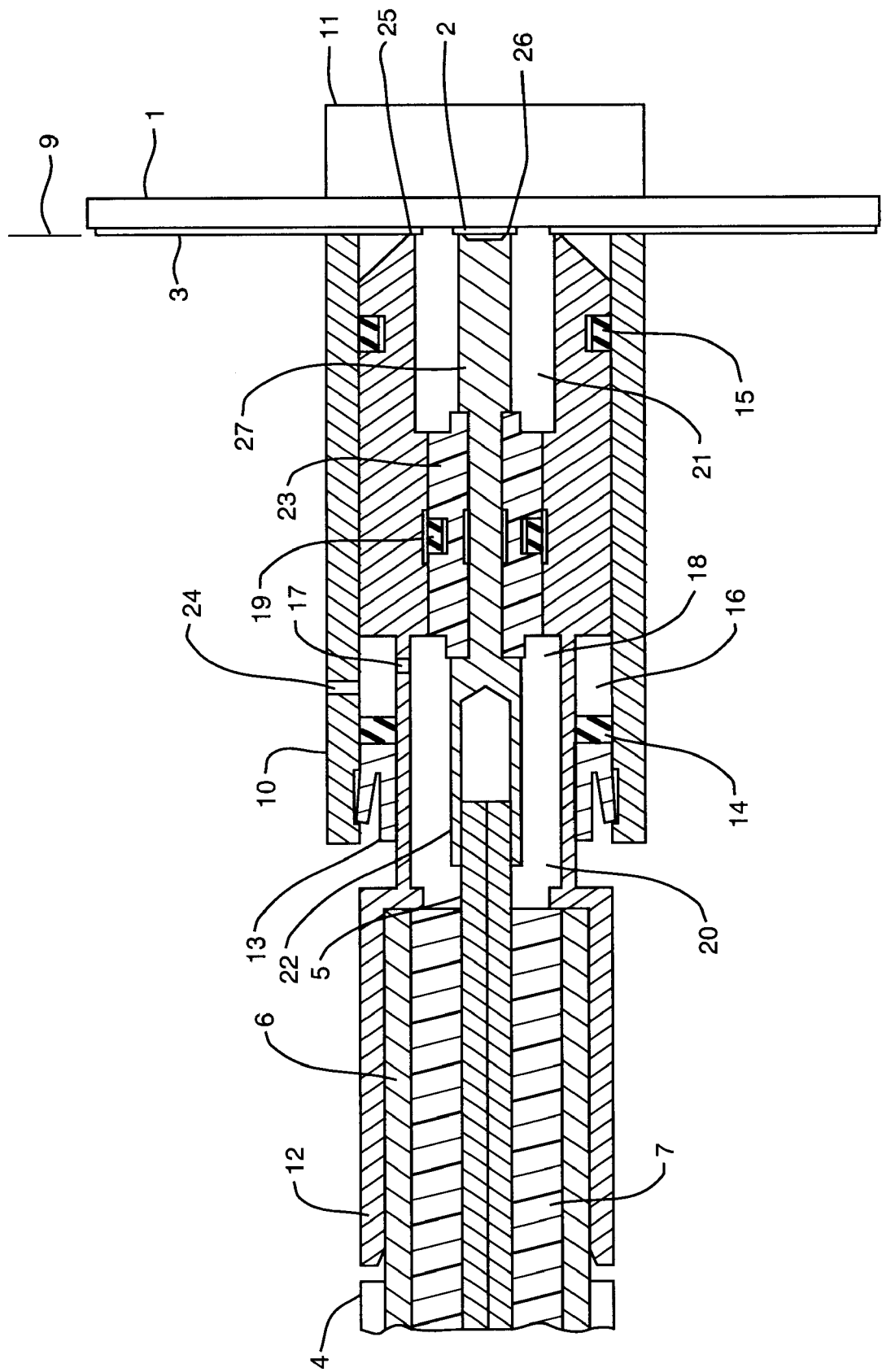
FIG. 5 is a sectional view showing the pneumatically operated planar probe of FIG. 2 engaging a receiving structure, the energized probe being stabilized and positioned for optimum impedance transition between the transmission line and the receiving structure.

Referring now to FIGS. 3 and 5, it will be seen that contact is made at planar surface 9 through two free body extensions of the components of the transmission line 4, namely, outer conductor 6 and center conductor 5. The outer conductor 6 is attached to first probe body 12, a multi-cylinder body that is slidably supported in a probe guide or header 10. A retainer 13 forms a translation limit and a reaction point for at least one seal 14. At least one other seal 15 is located on first probe body 12 such that pneumatic pressure from reservoir 52 can be introduced through at least one of the orifices 24 to pressurize a first annular volume 16. The header 10 and the receiving structure support 11 work in unison to constrain the receiving structure 1 during the pressurization cycle. Thus, the pressurization of first annular volume 16 causes the first probe body interface 25 to press against and become in pressurized contact with the ground planar surface 3 of the receiving structure 1, the first probe body 12 being freely slidable in header 10.

In the illustrated embodiment, the second probe body 27 is slidably supported by the dielectric body 23. Second probe body 27 includes the contact fingers 22 which engage center conductor 5. At least one seal 19 complements the dielectric body 23 and allows pressurization of a second annular volume 18 by means of at least one orifice 17 connecting the first annular volume 16 with the second annular volume 18. Thus, the pressurization of second annular volume 18 causes the second probe body interface 26 to press against and become in pressurized contact with signal planar surface 2 of the receiving structure 1. Both the first probe body interface 25 and the second probe body interface 26 independently mate the corresponding ground planar surface 3 and signal planar surface 2, respectively. Depending upon the geometric sizing arrangement, the forces exerted in the first annular volume 16 and the second annular volume 18 can be tailored in terms of piston sizes and pressurization range employed. Piston sizing consistent with electrical transmission impedance requirements can also be tailored.

In the embodiment shown in FIG. 5, reference characters 20 and 21 are pneumatic lines that carry a fluid, for example, an inert gas such as nitrogen, that are part of a multiplicity of compensated impedance sections between transmission line 4 and receiving structure 1. It will be readily understood by those skilled in the art that means other than pneumatic lines can be used as compensated impedance sections between transmission line 4 and receiving structure 1.

Figure 6:
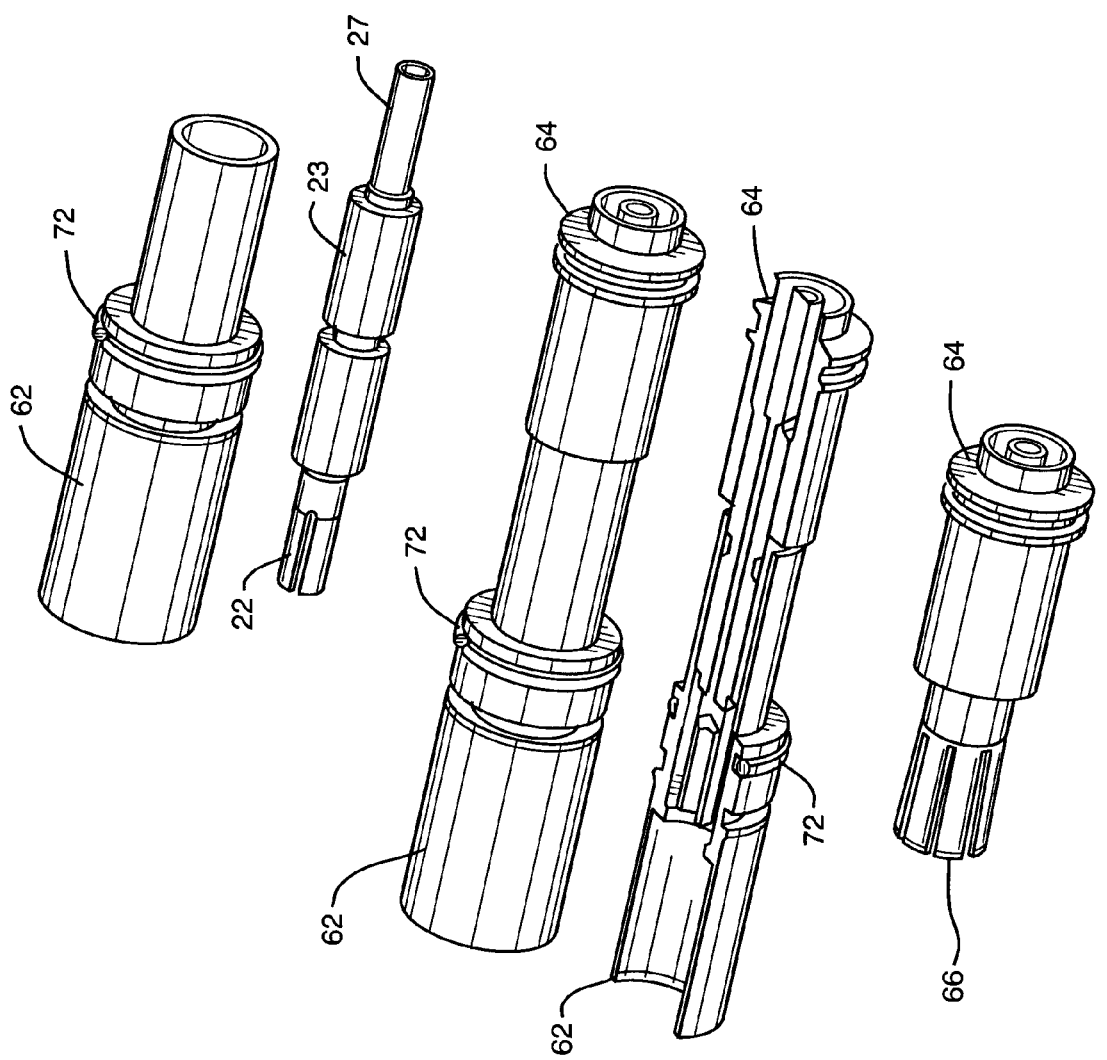
FIG. 6 is an exploded perspective view of an alternative pneumatic planar probe embodying the invention showing the various components of the alternative pneumatic planar probe.
Figure 7:
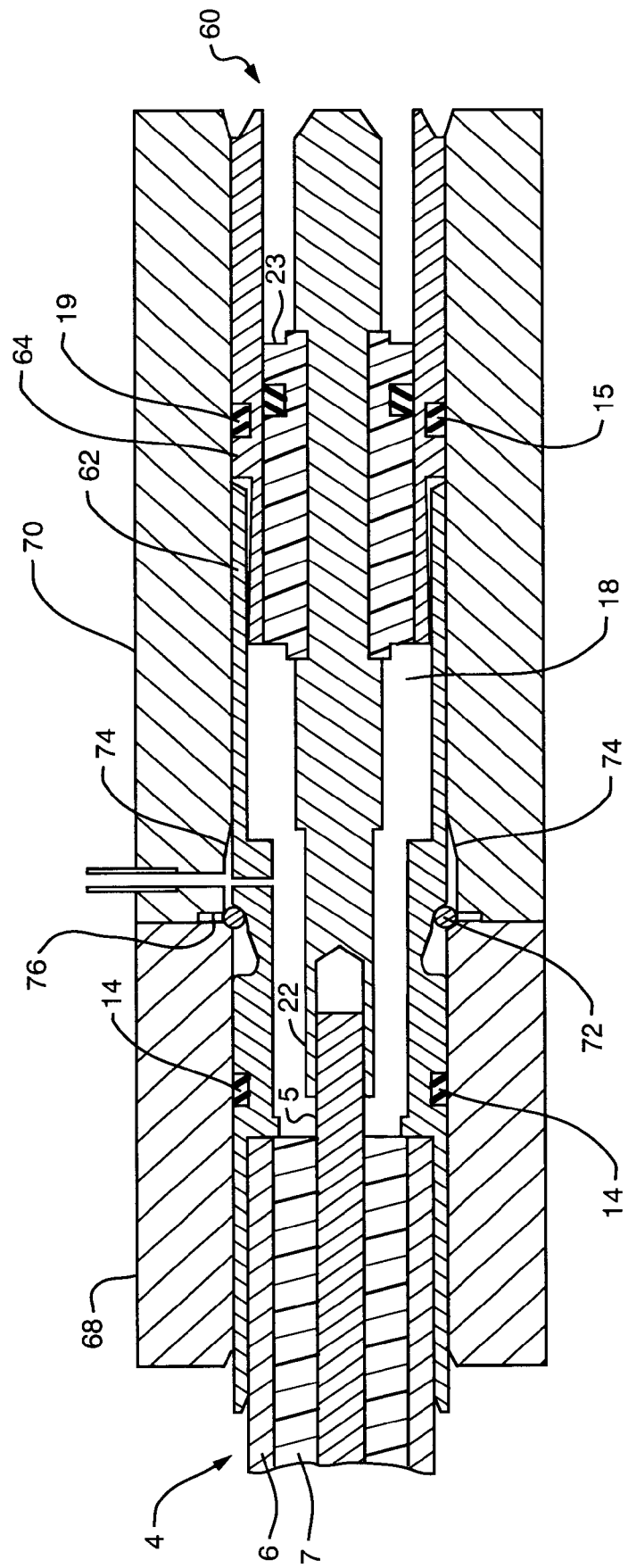
FIG. 7 is a sectional view showing an alternative embodiment of the pneumatic planar probe embodying the invention.

Referring now to FIGS. 6 and 7, there is shown an alternative embodiment of the invention in the form of a pneumatic planar probe 60. For convenience, common components of pneumatic planar probe 50 and pneumatic planar probe 60 are designated with the same reference characters. In the embodiment shown in FIG. 2, the transmission line 4 is pulled by actuation or movement of the probe 50. In the embodiment shown in FIG. 7, the transmission line 4 is not pulled or moved by the actuation or movement of the probe 60. That is, actuation or movement of the pneumatic planar probe 60 is independent of the transmission line 4. Accordingly, rigidity of the transmission line 4 has no effect on operation of the pneumatic planar probe 60 because the actuation or operation of the pneumatic planar probe 60 is independent of the transmission line 4.

As shown in FIGS. 6 and 7, the independent operation of pneumatic planar probe 60 is accomplished by dividing the first probe body 12 into two independently slidable members 62 and 64. Slidable member 62 is a first outer probe body and slidable member 64 is a second outer probe body. First outer probe body 62 and second outer probe body 64 are slidably moveable relative to one another and electromechanically interfaced to one another through a plurality of contact fingers 66. In the illustrated embodiment, contact fingers 66 are formed as an integral part of second outer probe body 64. The second probe body 27 and its associated features found in pneumatic planar probe 50 are retained in pneumatic planar probe 60 and function as previously described in connection with pneumatic planar probe 50. In the arrangement shown in FIGS. 6 and 7, pressurization will energize both second outer probe body 64 and the second probe body 27 as independent bodies relative to first outer probe body 62 and transmission line 4, thereby accomplishing the desired result. In pneumatic planar probe 60 shown in FIG. 9, probe guide or header 10 is replaced with a probe guide or header 67 having header members 68 and 70. Header member 68 is a first probe header and header member 70 is a second probe header. A retainer 72 acts to secure first outer probe body 62 relative to first probe header 68 during pneumatic operation of pneumatic planar probe 60. An annular bore 73 formed in second probe header 70 includes a conical section 74 and cylindrical section 76. Conical section 74 and cylindrical section 76 aid in pneumatic manifolding and probe removal.

Figure 8:
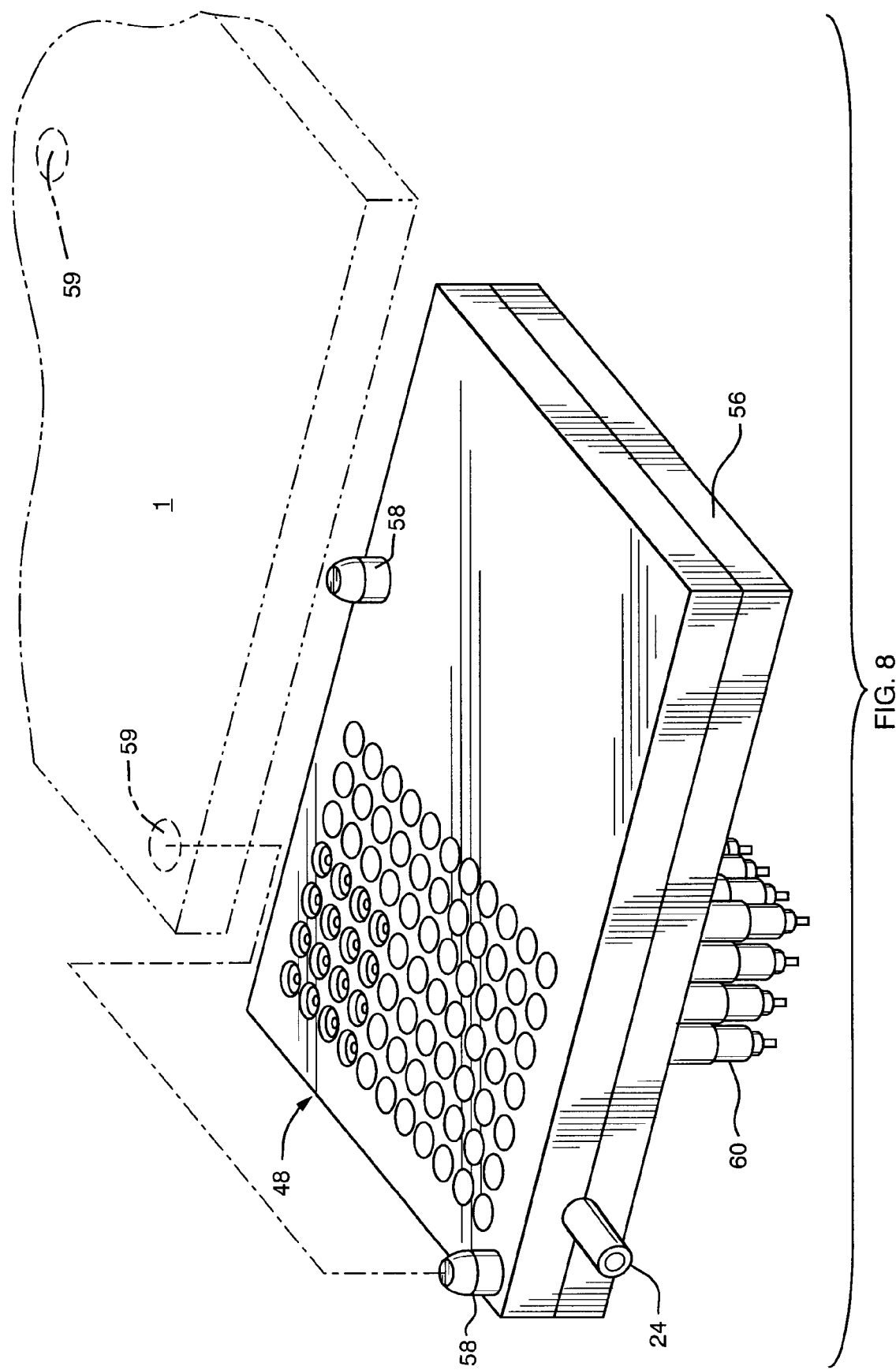
FIG. 8 shows an array of pneumatically operated planar probes embodying the invention mounted to a header.

FIG. 8 shows a header 56 with an array 48 of either pneumatic planar probe 50 or pneumatic planar probe 60, the header being provided with registration pins or posts 58 for aligning the header and receiving structure 1, the receiving structure being provided with openings 59 that are sized and shaped to receive the posts 58.

Figure 9:
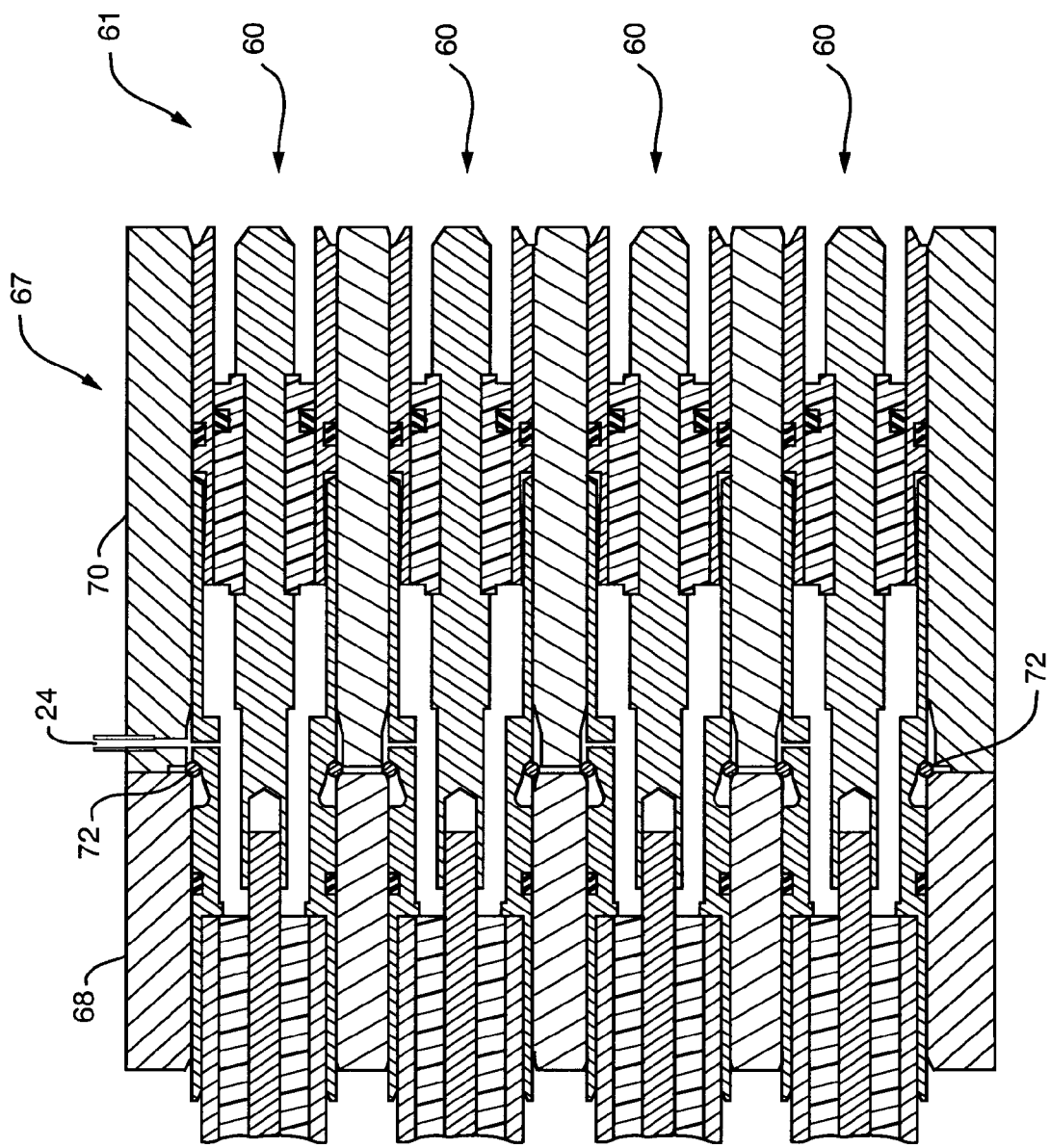
FIG. 9 is a sectional view of a header configuration embodying the invention in which a series of probes is shown in the operational pressurized state with a retainer of each probe engaged in a locked position.
Figure 10:
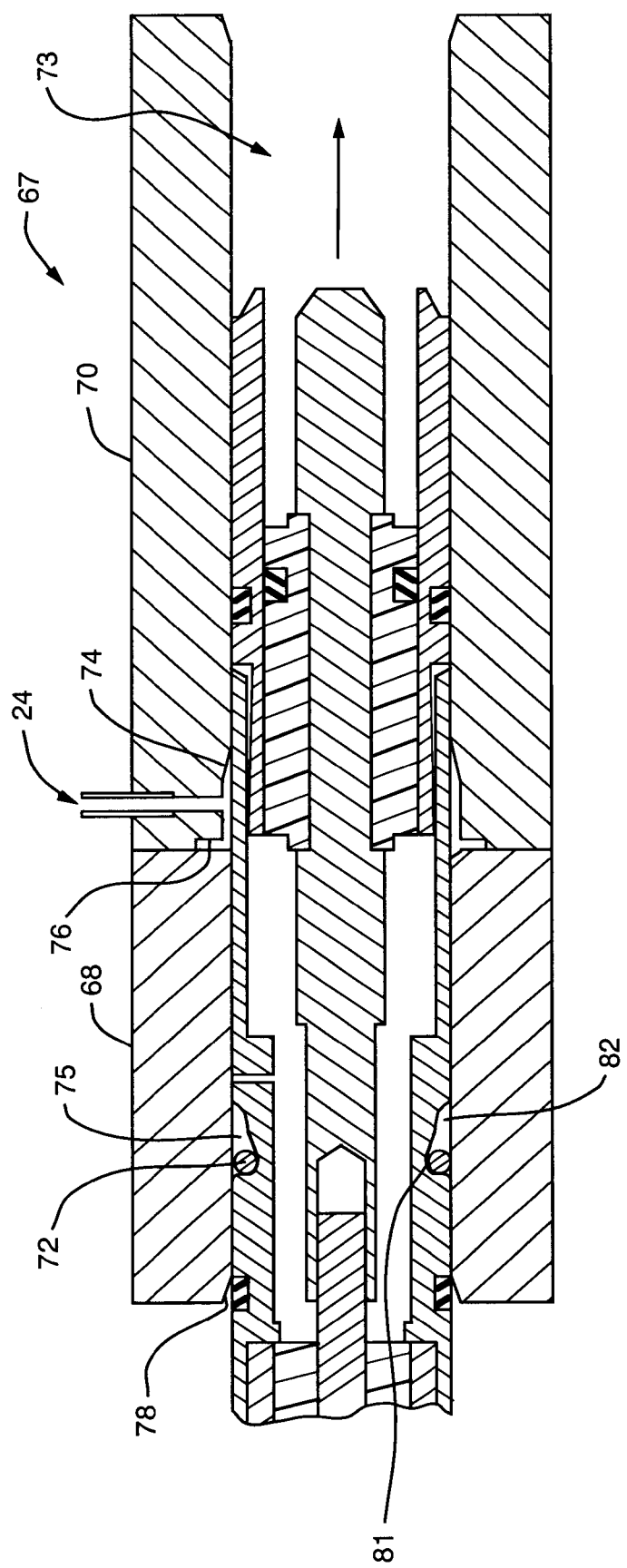
FIG. 10 is a sectional view of a header configuration embodying the invention with a single probe shown being installed into the header, a retainer being collapsed.
Figure 11:
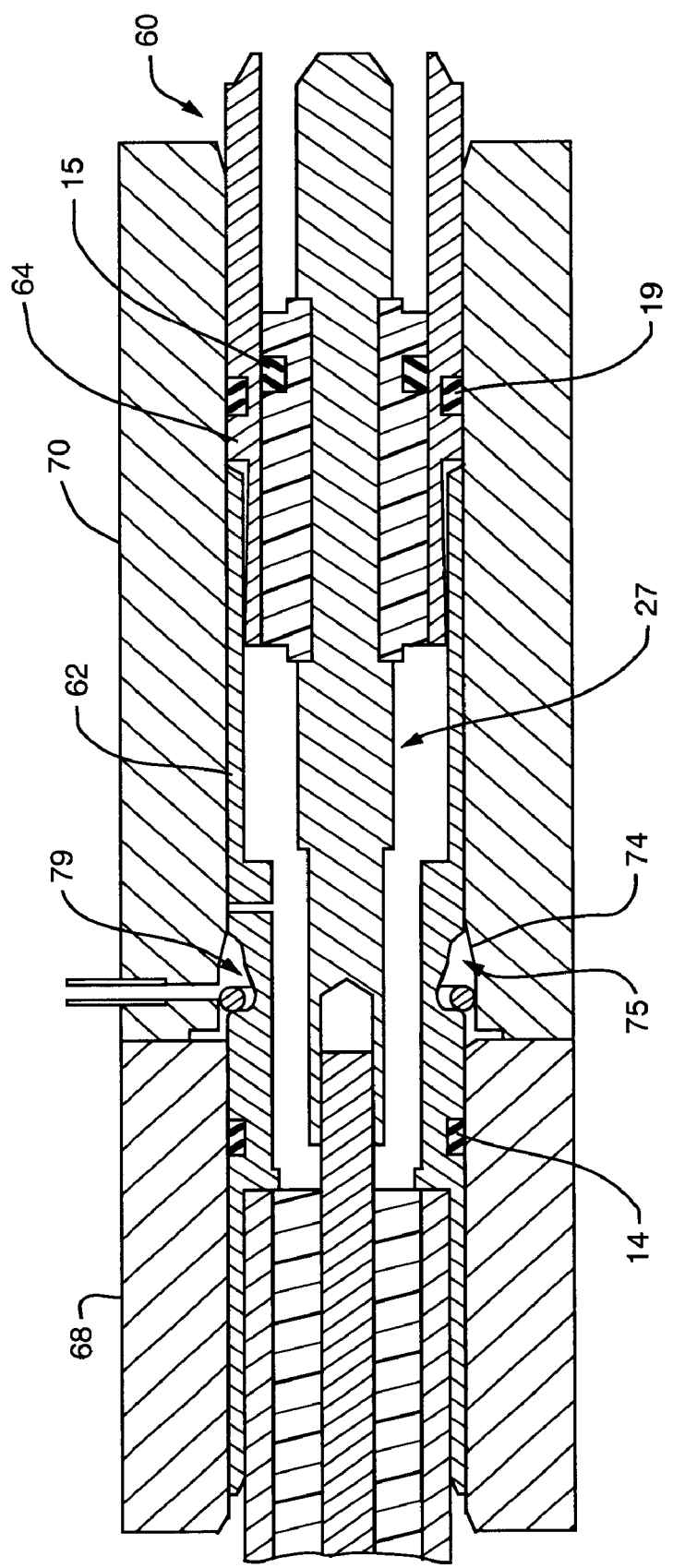
FIG. 11 is a sectional view of the header configuration of FIG. 10 with the single probe shown as it is initially installed in which the retainer is allowed to expand into the retaining cavity.
Figure 12:
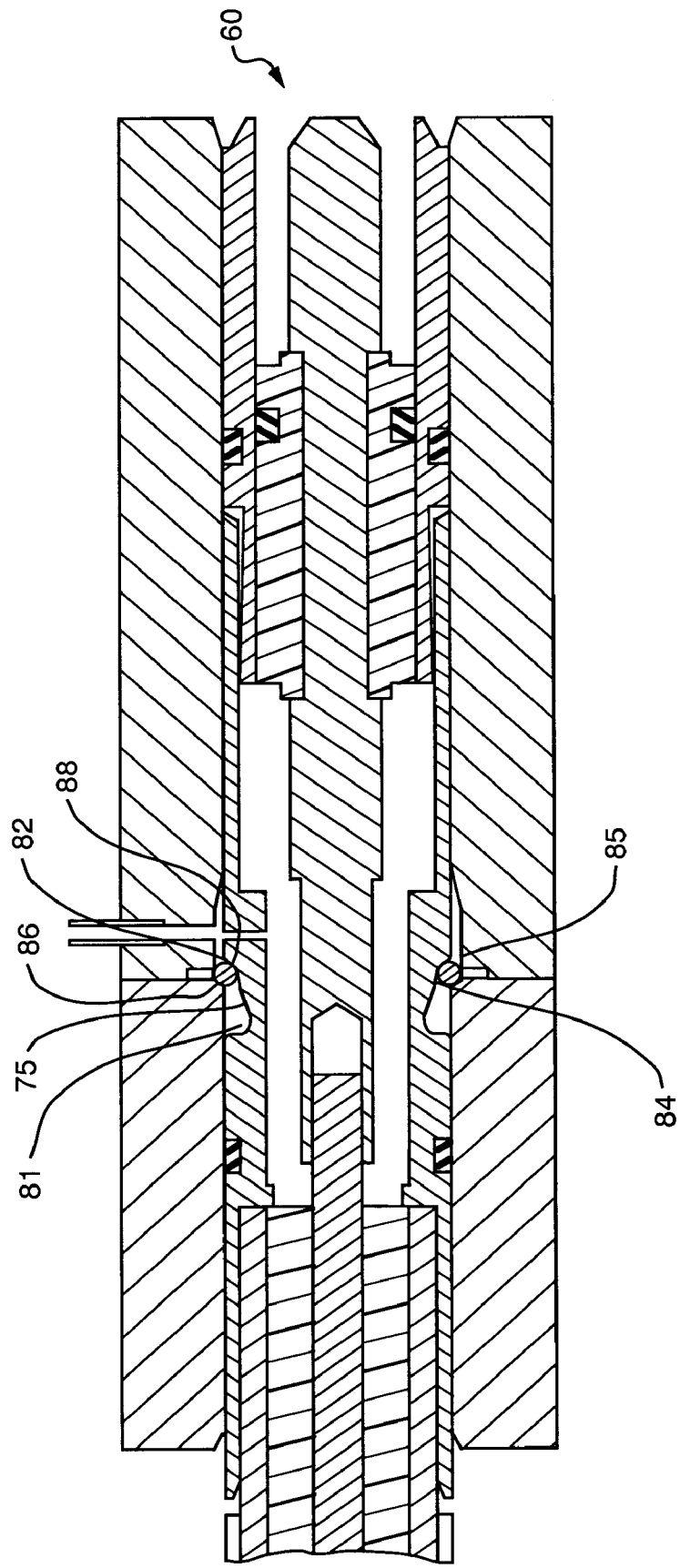
FIG. 12 is a sectional view of the header configuration of FIG. 10 with the single probe shown in the operational position in which the retainer is located under operational forces demonstrating the security of the retainer.
Figure 13:
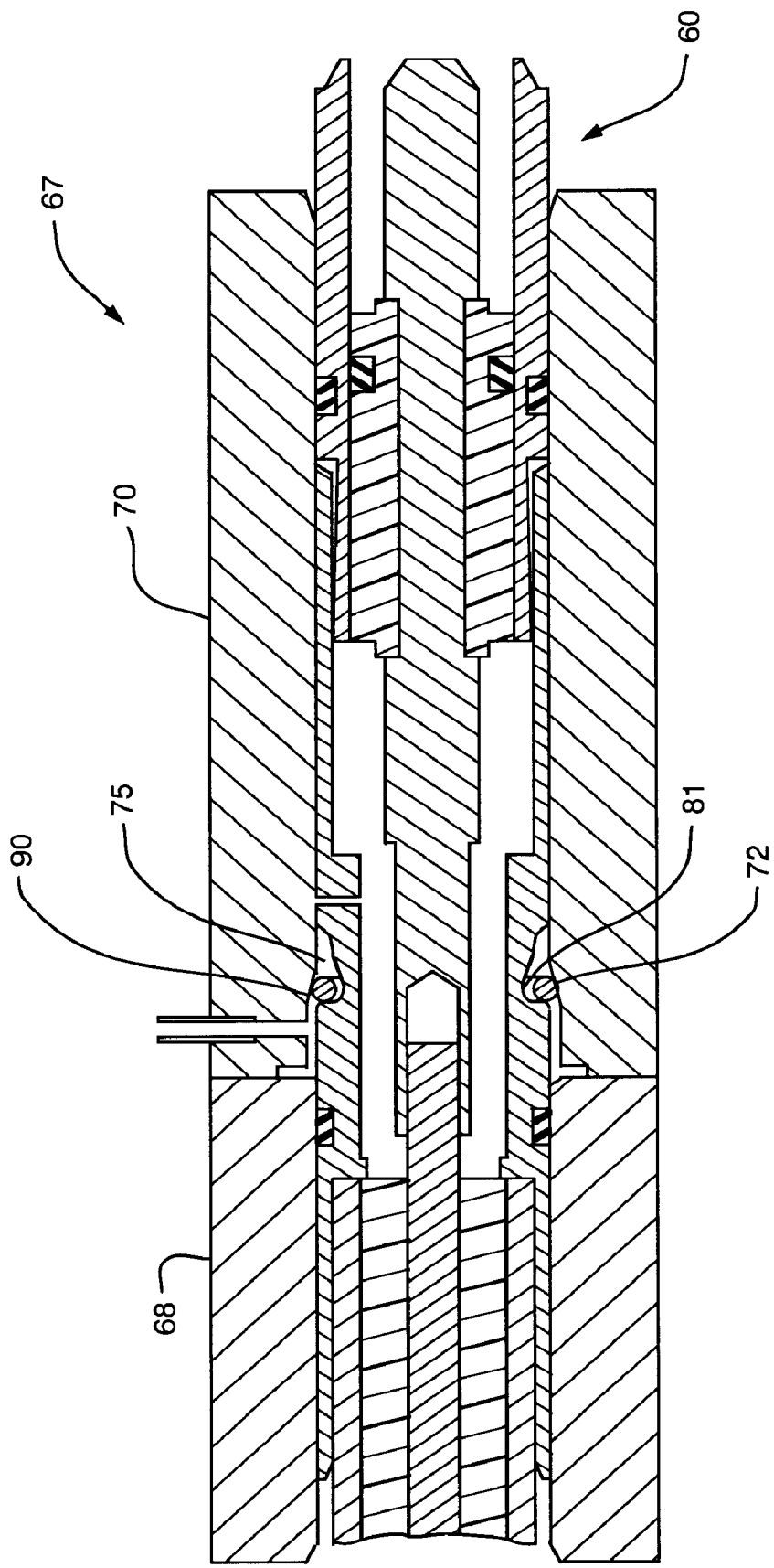
FIG. 13 is a sectional view of the header configuration of FIG. 10 with the single probe shown as it is initially moved for removal from the header, the retainer being collapsed.
Figure 14:
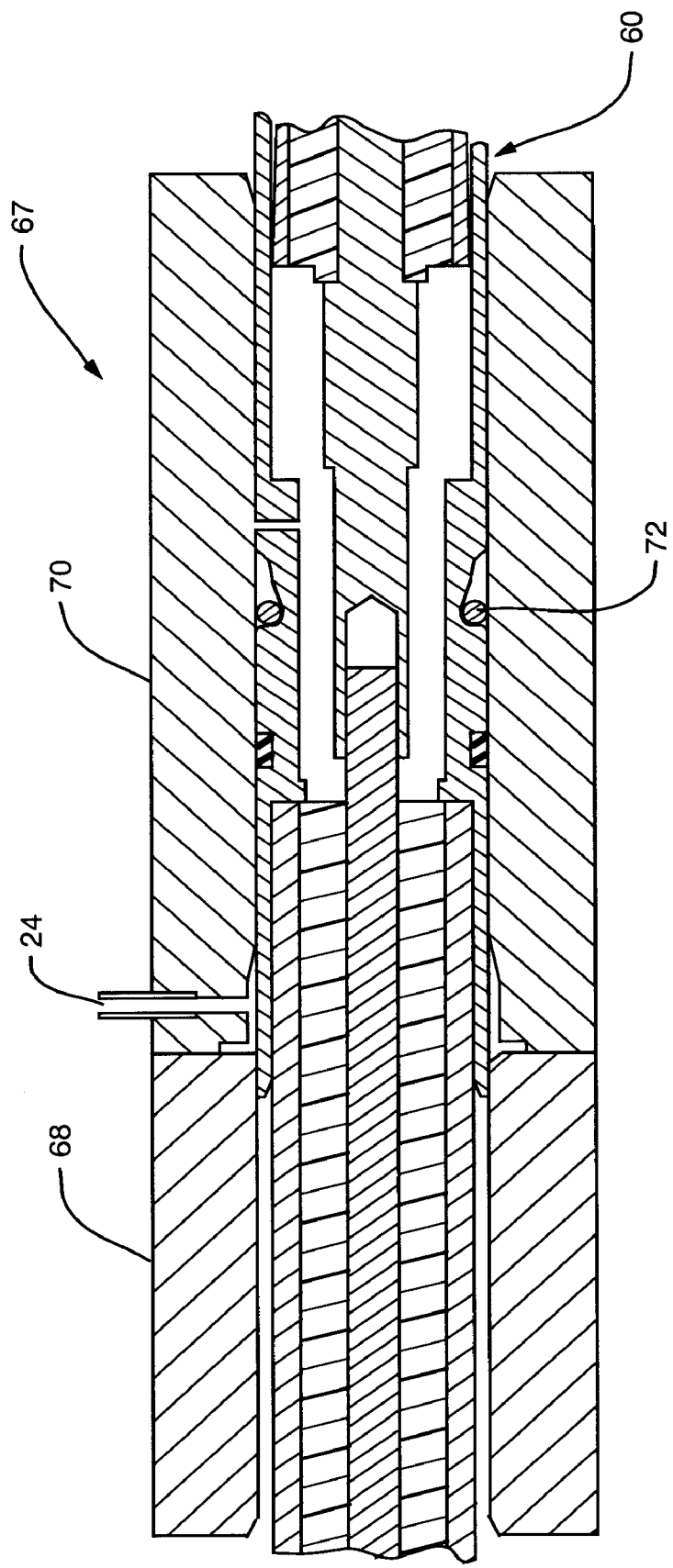
FIG. 14 is a sectional view of the header configuration of FIG. 13 with the single probe shown as it is moved forwardly, the retainer being fully collapsed.

Referring to FIG. 9, there is shown a plurality or an array 61 of the pneumatic planar probes 60 that are received in header 67 prior to connection with the receiving structure 1, each probe being held in place by a retainer 72. As hereinafter described, the design of each pneumatic planar probe 60 and associated retainer 72, for example, a retaining ring in the form of a snap ring having a circular cross section, facilitates removal of each individual pneumatic planar probe 60 from the header 67 for serviceability. Pressurization of pneumatic planar probe 60, when the header 67 is connected to the receiving structure 1, causes first outer probe body 62 and retainer 72 to be urged against first probe header 68 and second probe header 70. This results in a locking arrangement of the pneumatic planar probe 60 in header 67. The locking arrangement is not reversible during the pressurization cycle. Pneumatic pressure is introduced at inlet 24 into a series of interconnected annular bores 73 formed by the first outer probe body 62, first probe header 68 and second probe header 70 of each pneumatic planar probe 60 in array 61. FIGS. 10, 11 and 12 show the installation of a single pneumatic planar probe 60 into header 67. FIGS. 13 and 14 show the removal of the pneumatic planar probe 60 from header 67.

Referring to FIG. 10, a single pneumatic planar probe 60 is shown being installed into header 67. The retaining ring 72 has been collapsed radially during translation into the annular bore 73 formed in first probe header 68. Annular bore 73 has an enlarged conical entrance 78 which facilitates entry of pneumatic planar probe 60 and retaining ring 72. First outer probe body 62 accepts the collapsed retaining ring 72 within a bore 75 formed therein. Bore 75 has a widened or enlarged end 81 and a narrowed end 82. Inward movement of pneumatic planar probe 60 and of collapsed retaining ring 72 can continue unhindered so long as the retaining ring is collapsed.

FIG. 11 shows a release zone 79 formed by bore 75, the conical section 74 and cylindrical section 76 formed in the first outer probe body 62. Continued movement of the retaining ring 72 into release zone 79 allows the retaining ring to expand radially within the release zone 79. In this state, the pneumatic planar probe 60 can now be moved to its initial operating position.

Referring to FIG. 12, the locked operational position of pneumatic planar probe 60 is shown relative to the header 67. Physical positioning and/or pressurization translates the first outer probe body 62 and retaining ring 72 to the position shown in which the retaining ring 72 is restrained between a conical concentric surface 86 of first probe header 68 and a conical concentric surface 88 at the narrowed end 82 of bore 75. Additional secondary restraint is afforded by concentric bores 84 and 85 of first outer probe body 62 and second probe header 70, respectively. Longitudinal force in the locked direction maintains the probe 60 in its secure or locked position.

Referring to FIG. 13, the pneumatic planar probe 60 can be removed by pushing the probe forwardly so that the retaining ring 72 engages a concentric conically tapered leading surface 90 of second probe header 70. Continued movement of the pneumatic planar probe 60 in bore 73 collapses the retaining ring 72 in the widened end 81 of bore 75 and allows continued forward movement of the probe within the first probe header 68 and second probe header 70 for removal of the retaining ring 72.

Referring to FIG. 14, the retaining ring 72 is shown collapsed allowing the pneumatic planar probe 60 to translate through the header 67. First outer probe body 62 accepts the collapsed retaining ring 72 within bore 75. Forward movement of pneumatic planar probe 60 and retaining ring 72 can continue unhindered. When the retaining ring 72 is free of the bore 73 of second probe header 70, the retaining ring 72 can be removed from the pneumatic planar probe 60. Once removed, the pneumatic planar probe 60 can be withdrawn from the header 67 in the opposite direction. Replacing the retaining ring 72 after pneumatic planar probe 60 removal from the header 67 allows subsequent installation of the pneumatic planar probe 60 for operational use in the manner previously described.

Another embodiment of this invention could involve a plurality of non-concentric or concentric pistons, twinax or triaxial, for example, in which this same invention would have application. Similarly, an array of singular pistons with single contact points could also be constructed. Yet another embodiment entails the connection between two opposing planar surfaces.

Since certain changes may be made in the foregoing disclosure without departing from the scope of the invention herein involved, it is intended that all matter contained in the above description and depicted in the accompanying drawings be construed in an illustrative and not a limiting sense.

What is claimed is:

1. A pneumatic planar probe assembly that is adapted to connect a transmission line having a center conductor and an outer conductor to a receiving structure having a signal planar surface and a ground planar surface, said pneumatic planar probe assembly comprising:
   (a) a probe header;
   (b) a first probe body slidably mounted within said probe header, said first probe body having a first end and a second end, said first end of said first probe body being adapted to be connected to the outer conductor of the transmission line, said second end of said first probe body defining a first probe interface that is adapted to contact the ground planar surface of the receiving structure;
   (c) a second probe body having a first end and a second end, said first end of said second probe body adapted to be connected to the center conductor of the transmission line, said second end of said second probe body defining a second probe interface that is adapted to contact the signal planar surface of the receiving structure, said first probe body and said second probe body being moveable relative to one another;
   (d) a dielectric member providing support for the second probe body, said second probe body and said dielectric member being slidably mounted in said first probe body, said second probe body and said dielectric member being slidably moveable in said first probe body so that said first probe body interface and said second probe body interface can be positioned to achieve any planar position requirement of the receiving structure;
   (e) a plurality of contact fingers provided on said second probe body, said contact fingers configured to maintaining electrical continuity with the center conductor regardless of the incremental position of said second probe body relative to the center conductor;
   (f) a first annular volume disposed between said probe header and said first probe body, said first annular volume configured to be pressurized, said first probe body moving when said first annular volume is pressurized, said first probe interface being in pressurized contact with the ground planar surface of the receiving structure when said first probe body is moved by said pressurized first annular volume; and
   (g) a second annular volume formed by first probe body, said dielectric member and said second probe body, said second annular volume configured to be pressurized, said second probe body moving when said second annular volume is pressurized, said second probe interface being in pressurized contact with the signal planar surface of the receiving structure when said second probe body is moved by said pressurized second annular volume.

2. The pneumatic planar probe assembly as claimed in claim 1 wherein the pressurized contact of said first probe body and the ground plane surface is independent of the pressurized contact of the second probe body and the signal planar surface.

3. The pneumatic planar probe assembly as claimed in claim 1 including first sealing means positioned between said probe header and said first probe body for sealing said first annular volume.

4. The pneumatic planar probe assembly as claimed in claim 3 including second sealing means disposed between said first probe body and said dielectric member for sealing said second annular volume.

5. The pneumatic planar probe assembly as claimed in claim 1 including a first pneumatic inlet formed in said probe header through which a pneumatic fluid flows to said first annular volume for pressuring said first annular volume.

6. The pneumatic planar probe assembly as claimed in claim 5 including a second pneumatic inlet formed in said first probe body through which a pneumatic fluid flows to said second annular volume for pressurizing said second annular volume.

7. A pneumatic planar probe assembly that is adapted to connect a transmission line having a center conductor and an outer conductor to a receiving structure having a signal planar surface and a ground planar surface, said pneumatic planar probe assembly comprising:
   (a) a probe header;
   (b) a first probe body having first and second members, said second member slidably relative to said first member, slidably mounted within said probe header, said first member having a first end and a second end, said second member having a first end and a second end, said first end of said first member being adapted to be connected to the outer conductor of the transmission line, said second end of said first member and said first end of said second member connected for slidable telescopic movement relative to one another, said second end of said second member defining a first probe interface that is adapted to contact the ground planar surface of the receiving structure;
   (c) a second probe body having a first end and a second end, said first end of said second probe body adapted to be connected to the center conductor of the transmission line, said second end of said second probe body defining a second probe interface that is adapted to contact the signal planar surface of the receiving structure, said second member and said second probe body being moveable relative to one another;
   (d) a dielectric member providing support for the second probe body, said second probe body and said dielectric member being slidably mounted in said second member, said second probe body and said dielectric member being slidably moveable in said second member so that said first probe body interface and said second probe body interface can be positioned to achieve any planar position requirement of the receiving structure;

(e) a plurality of first contact fingers provided on said first end of said second member, said first contact fingers configured to maintain electrical continuity between said first and second members regardless of the incremental position of said second member relative to said first member;

(f) a plurality of second contact fingers provided on said second probe body, said second contact fingers configured to maintain electrical continuity with the center conductor regardless of the incremental position of said second probe body relative to the center conductor;

(g) a first annular volume disposed between said probe header and said first and second members, said first annular volume configured to be pressurized, said second member moving when said first annular volume is pressurized, said first probe interface being in pressurized contact with the ground planar surface of the receiving structure when said second member is moved by said pressurized first annular volume; and (h) a second annular volume formed by said first member, said second member, said dielectric member and said second probe body, said second annular volume configured to be pressurized, said second probe body moving when said second annular volume is pressurized, said second probe interface being in pressurized contact with the signal planar surface of the receiving structure when said second probe body is moved by said pressurized annular volume.

8. The pneumatic planar probe assembly as claimed in claim 7 wherein the pressurized contact of said second member and the ground plane surface is independent of the pressurized contact of the second probe body and the signal planar surface.

9. The pneumatic planar probe assembly as claimed in claim 7 wherein said probe header includes a first probe header and a second probe header.

10. The pneumatic planar probe assembly as claimed in claim 9 including retaining means for locking said first probe body in said probe header.

11. The pneumatic planar probe assembly as claimed in claim 7 including first sealing means positioned between said probe header and said first probe body for sealing said first annular volume.

12. The pneumatic planar probe assembly as claimed in claim 11 including second sealing means disposed between said second member and said dielectric member for sealing said second annular volume.

13. The pneumatic planar probe assembly as claimed in claim 7 including an air inlet formed in said probe header through which body air flows to said first annular volume for pressuring said first annular volume.

14. The pneumatic planar probe assembly as claimed in claim 13 including a second air inlet formed in said first probe body through which air flows to said second annular volume for pressurizing said second annular volume.

15. A pneumatic planar probe assembly that is adapted to connect a transmission line having a center conductor and an outer conductor to a receiving structure having a signal planar surface and a ground planar surface, said pneumatic planar probe comprising:

(a) a probe header;

(b) a first probe body slidably mounted within said probe header, said first probe body having a first end and a second end, said first end of said first probe body being adapted to be connected to the outer conduct of the transmission line, said second end of said first probe body defining a first probe interface that is adapted to contact the ground planar surface of the receiving structure;

(c) a second probe body having a first end and a second end, said first end of said second probe body adapted to be connected to the center conductor of the transmission line, said second end of said second probe body defining a second probe interface that is adapted to contact the signal planar surface of the receiving structure, said first probe body and said second probe body being moveable relative to one another;

(d) a dielectric member supporting said second probe body, said second probe body concentrically disposed within said first probe body, said second probe body and said dielectric member being slidably mounted in said first probe body, said second probe body and said dielectric member being slidably moveable in said first probe body so that said first probe body interface and said second probe body interface can be positioned to achieve any planar position requirement of the receiving structure;

(e) a plurality of contact fingers provided on said second probe body, said contact fingers configured to maintaining electrical continuity with the center conductor regardless of the incremental position of said second probe body relative to the center conductor;

(f) a first annular volume configured to be pressurized, said first probe body moving when said first annular volume is pressurized, said first probe interface being in pressurized contact with the ground planar surface of the receiving structure when said first probe body is moved by said pressurized first annular volume;

(g) a second annular volume formed by configured to be pressurized, said second probe body moving when said second annular volume is pressurized, said second probe interface being in pressurized contact with the signal planar surface of the receiving structure when second probe body is moved by said pressurized second annular volume; and (h) pressurizing means operatively connected to said first annular volume and said second annular volume for selectively pressurizing said first annular volume and said second annular volume.

16. A pneumatic planar probe assembly that is adapted to connect a transmission line having a center conductor and an outer conductor to a receiving structure having a signal planar surface and a ground planar surface, said pneumatic planar probe assembly comprising:

(a) a probe header;

(b) a first probe body having first and second members, said second member slidably relative to said first member, slidably received within said probe header, said first member having a first end and a second end, said second member having a first end and a second end, said first end of said first member being adapted to be connected to the outer conductor of the transmission line, said second end of said first member and said first end of said second member connected for slidable telescopic movement relative to one another, said second end of said second member defining a first probe interface that is adapted to contact the ground planar surface of the receiving structure;

(c) a second probe body having a first end and a second end, said first end of said second probe body adapted to be connected to the center conductor of the transmission line, said second end of said second probe body defining a second probe interface that is adapted to contact the signal planar surface of the receiving structure, said second member and said second probe body being moveable relative to one another;

(d) a dielectric member providing support for the second probe body, said second probe body and said dielectric member being slidably mounted in said second member, said second probe body and said dielectric member being slidably moveable in said second member so that said first probe body interface and said second probe body interface can be positioned to achieve any planar position requirement of the receiving structure; and (e) retaining means for locking said first probe body in said probe header.

17. The pneumatic planar probe assembly as claimed in claim 16 wherein said retaining means is a snap ring having a compressed state and an expanded state.

18. The pneumatic planar probe assembly as claimed in claim 17 wherein said probe header is formed with a first cut-away portion and said first probe body is formed with a second cut-away portion, said first and second cut-away portions defining a release zone in which said snap ring moves from its compressed state to its expanded state for locking said first probe body in said probe header.

19. The pneumatic planar probe assembly as claimed in claim 18 wherein said probe header is formed with a bore having an enlarged entrance, said bore being sized and shaped to receive said first probe body, said snap ring positioned on said first probe body being compressed as said first probe body is inserted into said entrance of said bore towards said first and second cut-away portions.

20. The pneumatic planar probe assembly as claimed in claim 19 wherein said first cut-away portion are formed with a ramp that operates to compress said snap ring as said first probe body is pushed through said first and second cut-away portions.

21. A pneumatic planar probe that is adapted to connect a transmission line having a center conductor and an outer conductor to a receiving structure having a signal planar surface and a ground planar surface, said pneumatic planar probe comprising:

(a) a first probe body slidably mounted within said probe header, said first probe body having a first end and a second end, said first end of said first probe body being adapted to be connected to the outer conductor of the transmission line, said second end of said first probe body defining a first probe interface that is adapted to contact the ground planar surface of the receiving structure;

(b) a second probe body having a first end and a second end, said first end of said second probe body adapted to be connected to the center conductor of the transmission line, said second end of said second probe body defining a second probe interface that is adapted to contact the signal planar surface of the receiving structure, said first probe body and said second probe body being moveable relative to one another;

(c) a dielectric member providing support for the second probe body, said second probe body and said dielectric member being slidably mounted in said first probe body, said second probe body and said dielectric member being slidably moveable in said first probe body so that said first probe body interface and said second probe body interface can be positioned to achieve any planar position requirement of the receiving structure;

(d) a plurality of contact fingers provided on said second probe body, said contact fingers configured to maintaining electrical continuity with the center conductor regardless of the incremental position of said second probe body relative to the center conductor;

(e) a first annular volume disposed between said probe header and said first probe body, said first annular volume configured to be pressurized, said first probe body moving when said first annular volume is pressurized, said first probe interface being in pressurized contact with the ground planar surface of the receiving structure when said first probe body is moved by said pressurized first annular volume; and (f) a second annular volume formed by first probe body, said dielectric member and said second probe body, said second annular volume configured to be pressurized, said second probe body moving when said second annular volume is pressurized, said second probe interface being in pressurized contact with the signal planar surface of the receiving structure when said second probe body is moved by said pressurized second annular volume.

22. A pneumatic planar probe that is adapted to connect a transmission line having a center conductor and an outer conductor to a receiving structure having a signal planar surface and a ground planar surface, said pneumatic planar probe comprising:

(a) a first probe body having first and second members, said second member slidably relative to said first member, slidably received within said probe header, said first member having a first end and a second end, said second member having a first end and a second end, said first end of said first member being adapted to be connected to the outer conductor of the transmission line, said second end of said first member and said first end of said second member connected for slidable telescopic movement relative to one another, said second end of said second member defining a first probe interface that is adapted to contact the ground planar surface of the receiving structure;

(b) a second probe body having a first end and a second end, said first end of said second probe body adapted to be connected to the center conductor of the transmission line, said second end of said second probe body defining a second probe interface that is adapted to contact the signal planar surface of the receiving structure, said second member and said second probe body being moveable relative to one another; and (c) a dielectric member providing support for the second probe body, said second probe body and said dielectric member being slidably mounted in said second member, said second probe body and said dielectric member being slidably moveable in said second member so that said first probe body interface and said second probe body interface can be positioned to achieve any planar position requirement of the receiving structure.

* * * * *